(12) United States Patent
Liao

(10) Patent No.: US 11,222,829 B2
(45) Date of Patent: Jan. 11, 2022

(54) ELECTRONIC DEVICE MOUNTING STRUCTURE AND MOUNTING DEVICE TO MOUNT SUCH ELECTRONIC DEVICE

(71) Applicant: Skiileux Electricity Inc., Taoyuan (TW)

(72) Inventor: Chien-Shou Liao, New Taipei (TW)

(73) Assignee: Skiileux Electricity Inc., Taoyuan (TW)

( * ) Notice: Subject to any disclaimer, the term of this patent is extended or adjusted under 35 U.S.C. 154(b) by 0 days.

(21) Appl. No.: 16/551,575

(22) Filed: Aug. 26, 2019

(65) Prior Publication Data

US 2020/0294879 A1 Sep. 17, 2020

(30) Foreign Application Priority Data

Mar. 15, 2019 (TW) .................................. 108108998

(51) Int. Cl.
| | | |
|---|---|---|
| *H01L 23/34* | (2006.01) | |
| *H01L 25/065* | (2006.01) | |
| *H01L 25/075* | (2006.01) | |
| *H01L 23/498* | (2006.01) | |
| *H01L 33/62* | (2010.01) | |
| *H01L 23/00* | (2006.01) | |

(52) U.S. Cl.
CPC ...... *H01L 23/345* (2013.01); *H01L 23/49838* (2013.01); *H01L 24/16* (2013.01); *H01L 25/0655* (2013.01); *H01L 25/0753* (2013.01); *H01L 33/62* (2013.01); *H01L 2224/16227* (2013.01)

(58) Field of Classification Search
CPC ............... H01L 23/345; H01L 25/0655; H01L 25/0753; H01L 23/49838; H01L 33/62; H01L 24/16; H01L 2224/16227
See application file for complete search history.

(56) References Cited

U.S. PATENT DOCUMENTS

| | | | | |
|---|---|---|---|---|
| 2013/0134606 A1* | 5/2013 | Im | ............................ | H01L 24/32 257/778 |
| 2013/0249228 A1* | 9/2013 | Lai | ....................... | H01L 21/6838 294/185 |
| 2014/0043033 A1* | 2/2014 | Butters | ............... | G01R 31/2656 324/501 |
| 2015/0305159 A1* | 10/2015 | Yamamoto | ................ | H01G 4/40 361/767 |
| 2019/0058099 A1* | 2/2019 | Oh | ........................... | H01L 33/36 |
| 2019/0081200 A1 | 3/2019 | Ting et al. | | |
| 2020/0227362 A1* | 7/2020 | Thibado | .................. | H05K 1/181 |

OTHER PUBLICATIONS

"Office Action of China Counterpart Application", dated Sep. 3, 2021, p. 1-p. 7.

* cited by examiner

*Primary Examiner* — Wasiul Haider
(74) *Attorney, Agent, or Firm* — JCIPRNET

(57) ABSTRACT

A chip mounting structure and a chip mounting device are provided. The chip mounting structure includes a circuit substrate and a plurality of micro heaters. The circuit substrate has a plurality of solder pads. A plurality of micro heaters are disposed on the circuit substrate adjacent to the solder pad. The plurality of chips are disposed on the circuit substrate, and the chip is electrically connected to the solder pad by a solder ball. Therefore, the soldering yield of the process can be reduced by the chip mounting structure and the chip mounting device.

15 Claims, 9 Drawing Sheets

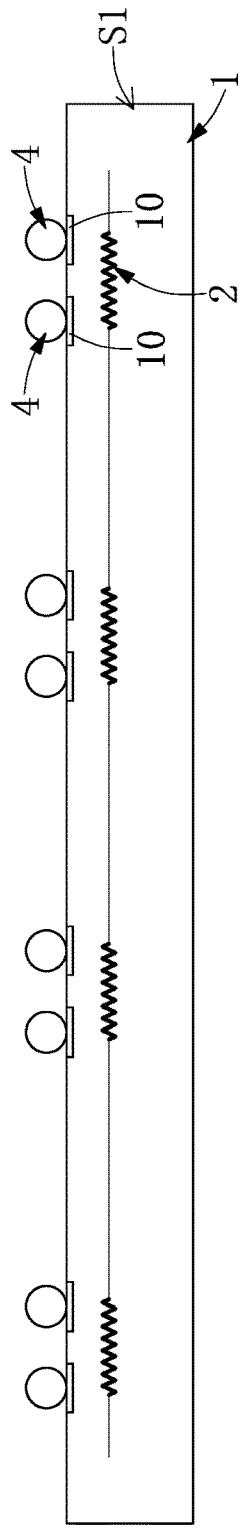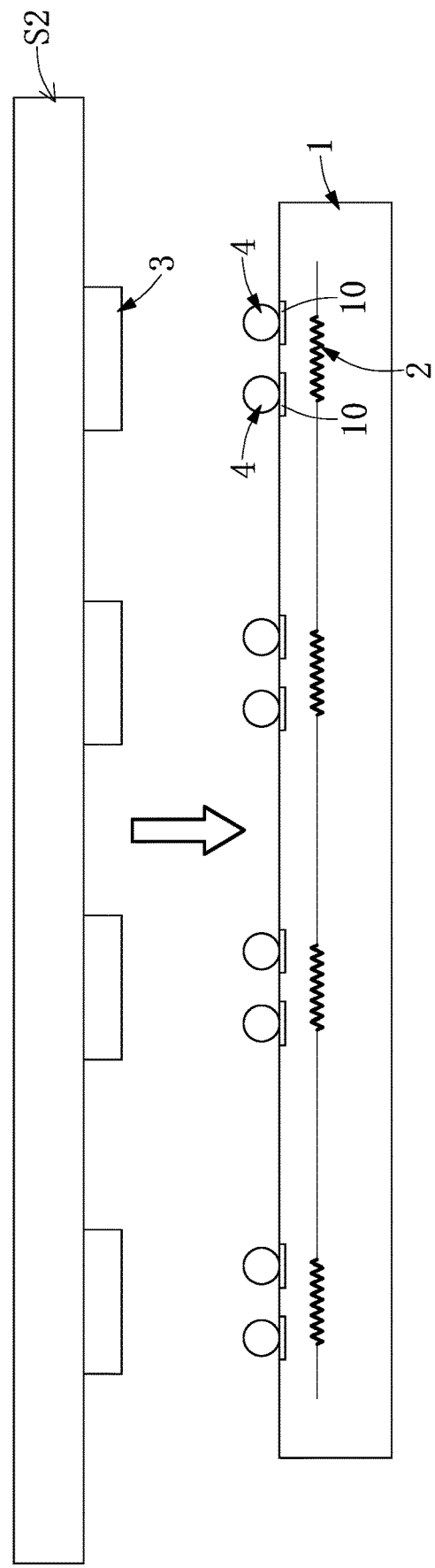

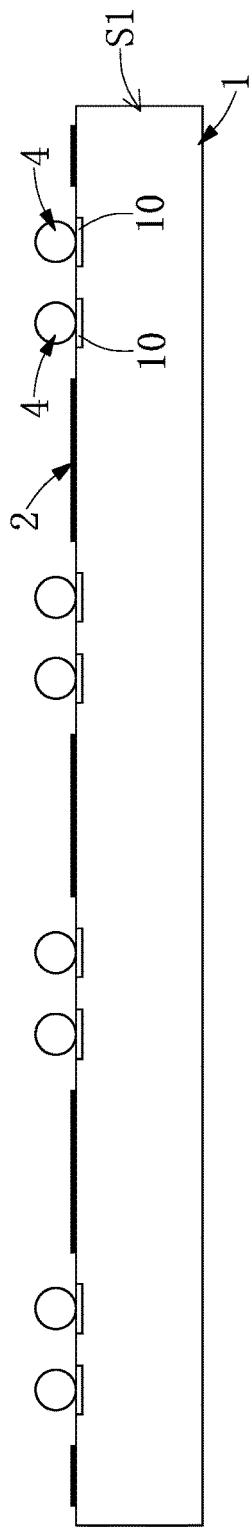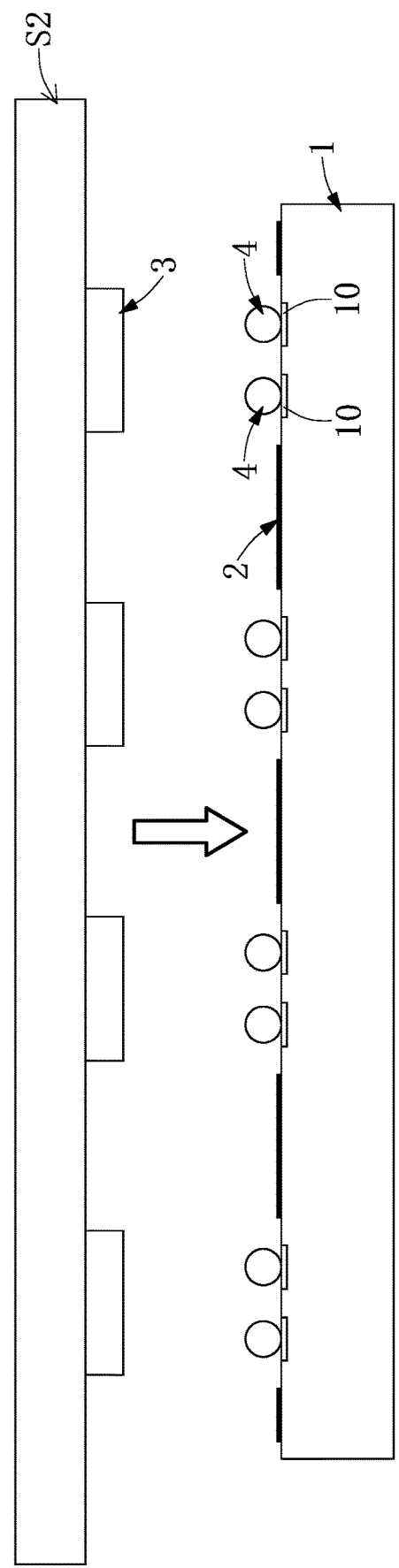
FIG. 10
FIG. 11

ELECTRONIC DEVICE MOUNTING STRUCTURE AND MOUNTING DEVICE TO MOUNT SUCH ELECTRONIC DEVICE

CROSS-REFERENCE TO RELATED PATENT APPLICATION

This application claims the benefit of priority to Taiwan Patent Application No. 108108998, filed on Mar. 15, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a carrier structure and carrier device, and more particularly to a chip mounting structure and a chip mounting device.

BACKGROUND OF THE DISCLOSURE

In recent years, with the rapid development of electronic and semiconductor technologies, electronic products have been continuously modernized and are designed to be light, thin, short, and small. Circuit boards are widely used in various electronic devices. The surface of the circuit board usually has a plurality of solder pads. In the process, solders are formed on the solder pads of the circuit board, and then various electronic components are mounted onto the circuit board by a reflow process, and thus each electronic component is electrically connected to each other through a circuit layer in the circuit board.

At present, the reflow process can be performed by using different reheating methods such as those using a reflow furnace, an infrared heating lamp or a heat gun. Although the above-mentioned reheating treatment method generally meets the requirements of use, there is still a need to improve the process to improve the yield and performance of the process and reduce the production cost.

SUMMARY OF THE DISCLOSURE

In response to the above-referenced technical inadequacies, the present disclosure provides a chip mounting structure and a chip mounting device.

In one aspect, the present disclosure provides a chip mounting structure including: a circuit substrate and a plurality of micro heaters. The circuit substrate has a plurality of solder pads. The micro heaters are disposed on the circuit substrate adjacent to the solder pads. A plurality of chips are disposed on the circuit substrate, and the chips are electrically connected to the solder pad by solder balls.

In one aspect, the present disclosure provides a chip mounting structure including: a circuit substrate and at least one micro heater. The circuit substrate carries at least one chip. The micro heater is carried by the circuit substrate to heat at least one solder ball that is in contact with the chip.

In one aspect, the present disclosure provides a chip mounting device including: a chip mounting structure and a suction structure. The chip mounting structure includes a circuit substrate and at least one micro heater carried by the circuit substrate. The suction structure is disposed above the chip mounting structure to suction and transfer the chip to the chip mounting structure. At least one chip is carried by the circuit substrate, and the micro heater heats at least one solder ball that is in contact with the chip.

One of the beneficial effects of the present disclosure is that, the chip mounting structure provided by the present disclosure has the technical features of "a circuit substrate including a plurality of solder pads," "a plurality of micro heaters disposed on the circuit substrate and being adjacent to the solder pads" and "a plurality of chips are disposed on the circuit substrate and the chip being electrically connected to the solder pad by a solder ball" so as to improve the soldering yield of the process.

Another beneficial effect of the present disclosure is that, the chip mounting structure provided by the present disclosure has the technical features of "a circuit substrate carrying at least one chip," and "at least one micro heater is carried by the circuit substrate to heat at least one solder ball that the chip is in contact with" so as to improve the soldering yield of the process.

Another beneficial effect of the present disclosure is that, the chip mounting device provided by the present disclosure has the technical features of "a chip mounting structure including a circuit substrate and at least one micro heater carried by the circuit substrate," "a suction structure disposed above the chip mounting structure to suction and transfer at least one chip to the chip mounting structure" and "the chip being carried by the circuit substrate, and the micro heaters heating at least one solder ball that is in contact with the chip" so as to improve the soldering yield of the process.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 1 is a schematic view of a chip mounting structure according to a first embodiment of the present disclosure.

FIG. 2 is a schematic view of the chip mounting structure according to the first embodiment of the present disclosure in use.

FIG. 10 is a schematic structural view of a chip mounting structure according to a second embodiment of the present disclosure.

FIG. 11 is a schematic view of the chip mounting structure according to the second embodiment of the present disclosure in use.

DETAILED DESCRIPTION OF THE EXEMPLARY EMBODIMENTS

Figure 3:
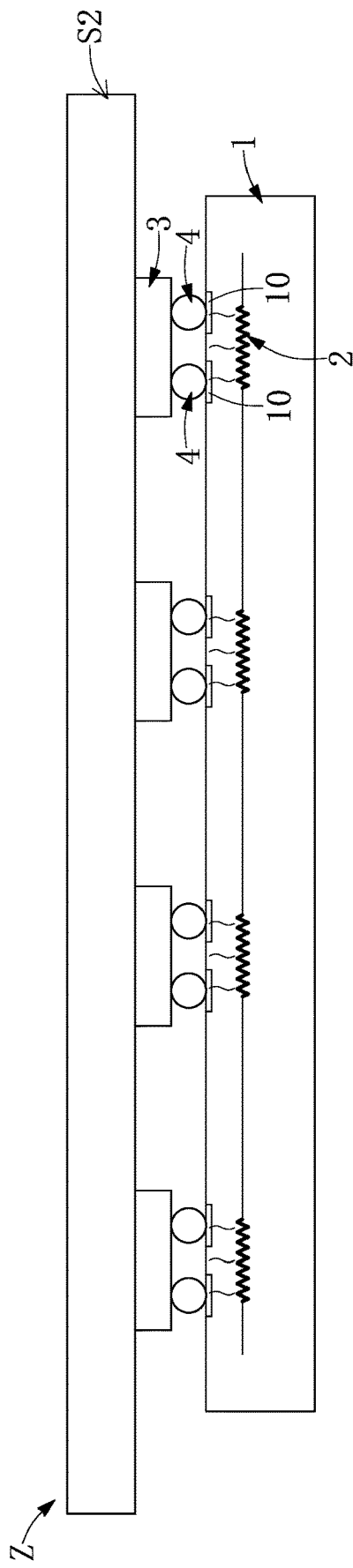
FIG. 3 is a schematic view of the chip mounting structure according to the first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 9, a first embodiment of the present disclosure provides a chip mounting structure S1 including: a circuit substrate 1 and at least one micro heater 2. The circuit substrate 1 carries at least one chip 3. The micro heater 2 is carried by the circuit substrate 1 to heat at least one solder ball 4 that is in contact with at least one chip 3.

Firstly, referring to FIG. 1, the chip mounting structure S1 of the present disclosure includes the circuit substrate 1 and the at least one micro heater 2. In the embodiment, a plurality of micro heaters 2 are taken as an example, but the present disclosure is not limited thereto. The circuit substrate 1 can be a single substrate or a composite substrate, but is not limited thereto. The circuit substrate 1 is provided with the plurality of micro heaters 2; the plurality of micro heaters 2 can be disposed in series or in parallel, and electrically connected to a power supply terminal (for example, a mains or a host, but not limited thereto), and the micro heater 2 can be disposed on the surface of the circuit substrate 1 or embedded in the circuit substrate 1. In the embodiment, the micro heaters 2 are embedded in the circuit substrate 1 as an example, but the present disclosure is not limited thereto. Also, the circuit substrate 1 further includes a plurality of solder pads 10. At least one solder ball 4, or other types of electrically conductive material, can be disposed on each of the solder pads 10. However, the above-mentioned examples are only one of the possible embodiments and the present disclosure is not limited thereto.

Next, as shown in FIG. 2 and FIG. 3, the present disclosure can suction the chip 3 through a suction structure S2, which can be a vacuum nozzle module or an electrostatic suction module. In this embodiment, an electrostatic suction module is used as an example but the present disclosure is not limited thereto. Further, the present disclosure can firstly suction one or more chips 3 by the suction structure S2 using the opposite charge suction force, and then place the chip 3 on the circuit substrate 1. Then, the chip 3 is carried on the circuit substrate 1 by the suction structure S2 canceling the suction of the opposite charge, and the plurality of chips 3 are respectively disposed above the plurality of micro heaters 2 respectively. The chip 3 is an IC chip or an LED chip.

Figure 4:
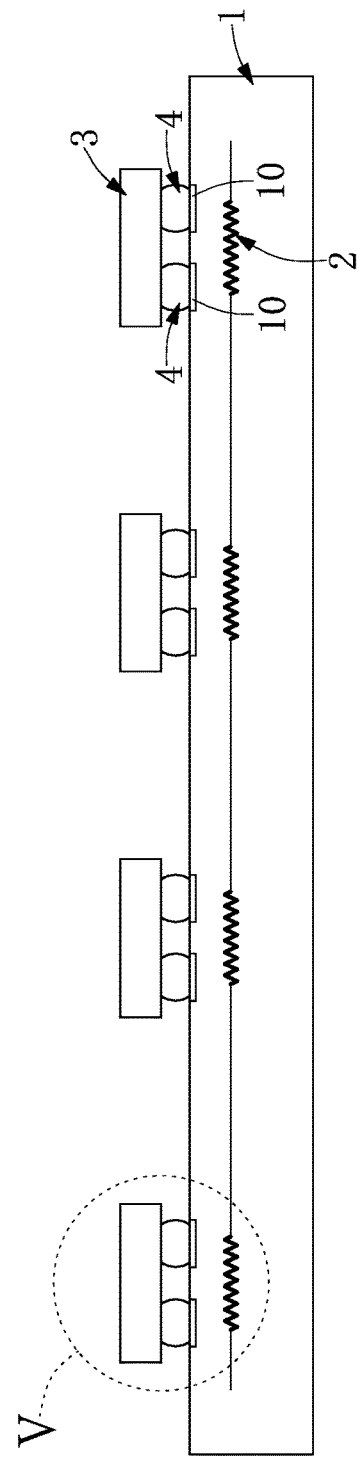
FIG. 4 is a schematic structural view of the chip mounting structure according to the first embodiment of the present disclosure.

Finally, as shown in FIG. 3 and FIG. 4, each micro heater 2 heats the solder ball 4. For example, after supplying electrical energy to each of the micro heaters 2, each of the micro heaters 2 can heat the corresponding solder ball 4 to soften the solder ball 4 and to generate a connection with the chip 3. Then, after the solder ball 4 is cured, the chip 3 is mounted onto the circuit substrate 1 and electrically connected to the solder pad 10 of the circuit substrate 1 through the solder ball 4. It should be noted that the circuit substrate 1 of the present disclosure can be provided with a feedback circuit unit (not shown, which mainly includes a driving circuit, a signal reading circuit, and a temperature control circuit) for controlling the heating temperature of the micro heater 2.

Figure 5:
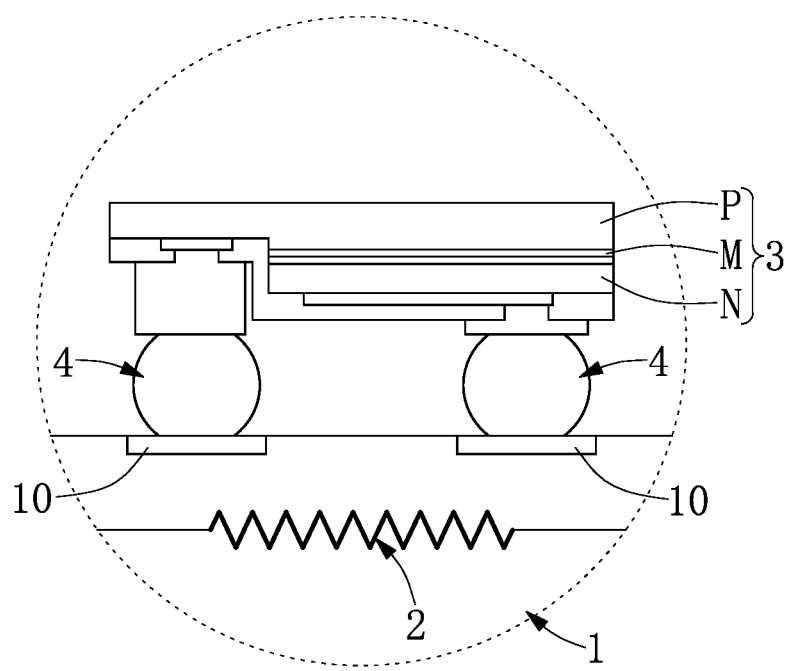
FIG. 5 is an enlarged schematic view of a portion V of FIG. 4.

Further, as shown in FIG. 4 and FIG. 5, each chip 3 may be a micro-semiconductor light-emitting element (micro LED) including an n-type conductive layer N disposed in a stack, a light-emitting layer M passed through by the laser source and a p-type conductive layer P. The n-type conductive layer N may be an n-type gallium nitride material layer or an n-type gallium arsenide material layer, the light-emitting layer M may be a multi-quantum well structure layer, and the p-type conductive layer P may be a p-type gallium nitride material layer or a p-type gallium arsenide material layer. Alternatively, each chip 3 may also be a sub-millimeter LED (mini LED), which includes a base layer (not shown), the n-type conductive layer N, and a laser source L that are disposed in a stack. A base layer 120 may be a sapphire material layer, the n-type conductive layer N may be an n-type gallium nitride material layer or an n-type gallium arsenide material layer, the light-emitting layer M may be a multi-quantum well structure layer, and the p-type conductive layer P may be a p-type gallium nitride material layer or a p-type gallium arsenide material layer. The base layer 120 may also be a quartz base layer, a glass base layer, a tantalum base layer, or a base layer of any material. However, the present disclosure is not limited thereto.

Figure 6:
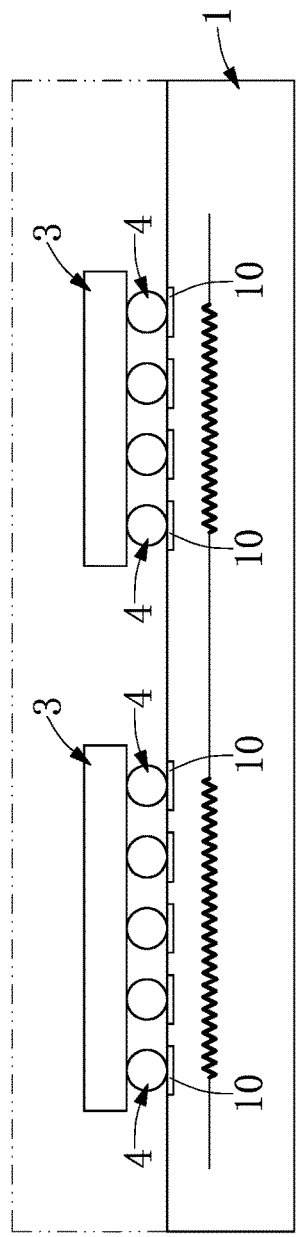
FIG. 6 is a schematic structural view of the chip mounting structure according to the first embodiment of the present disclosure.

Further, as shown in FIG. 6, the chip 3 of the present disclosure may also be a System in Package (SiP). For example, as shown in FIG. 1 to FIG. 6, the present disclosure can also transfer the chip 3 to the circuit substrate 1 through the suction structure S2. Then, the solder ball 4 is heated by each of the micro heaters 2, or by the heating method of the laser heating module S3 and the micro heater 2, so that the chip 3 is mounted onto the circuit substrate 1 and electrically connected to the circuit substrate 1 through the solder ball 4. Finally, black glue is overlaid on the circuit substrate 1 by semiconductor packaging technology (as in the imaginary line in FIG. 6).

Figure 7:
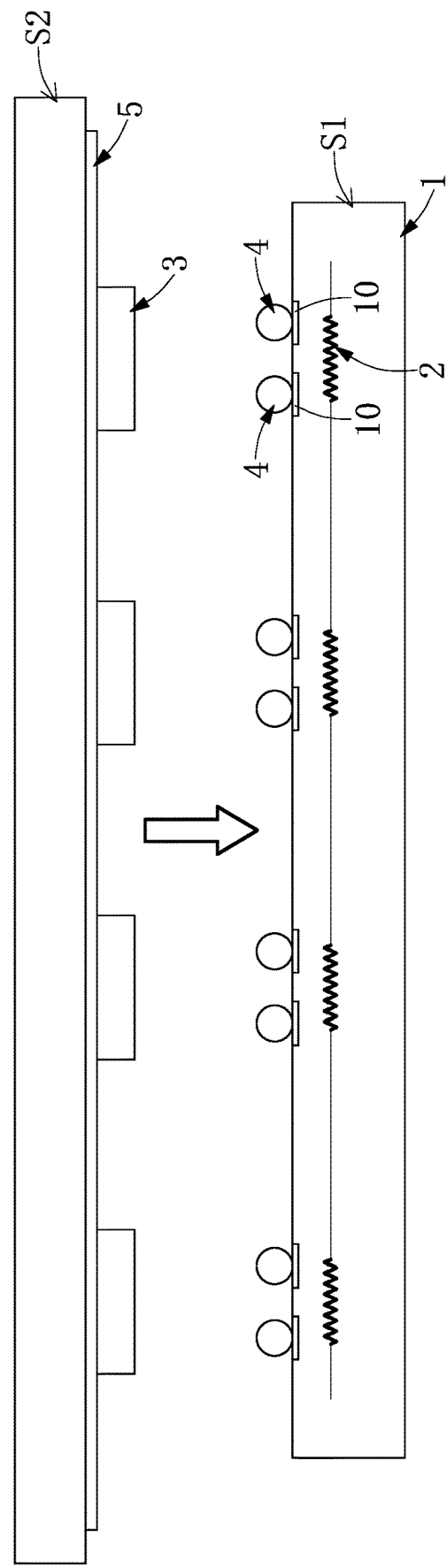
FIG. 7 is a schematic view of the chip mounting structure according to the first embodiment of the present disclosure in use.
Figure 8:
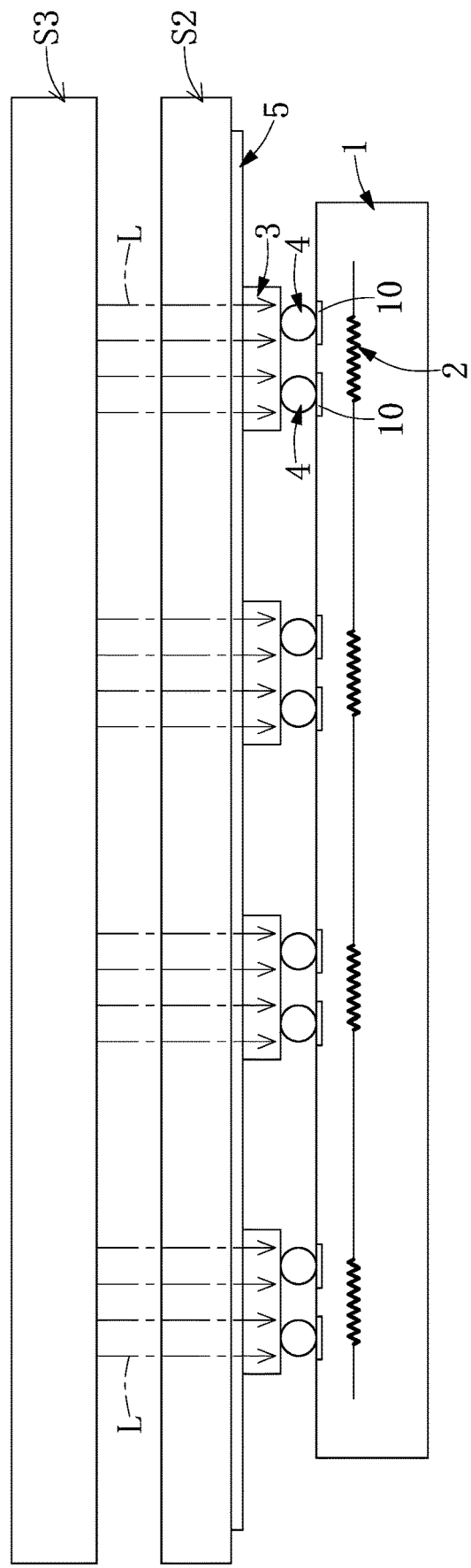
FIG. 8 is a schematic view of the chip mounting structure according to the first embodiment of the present disclosure in use.
Figure 9:
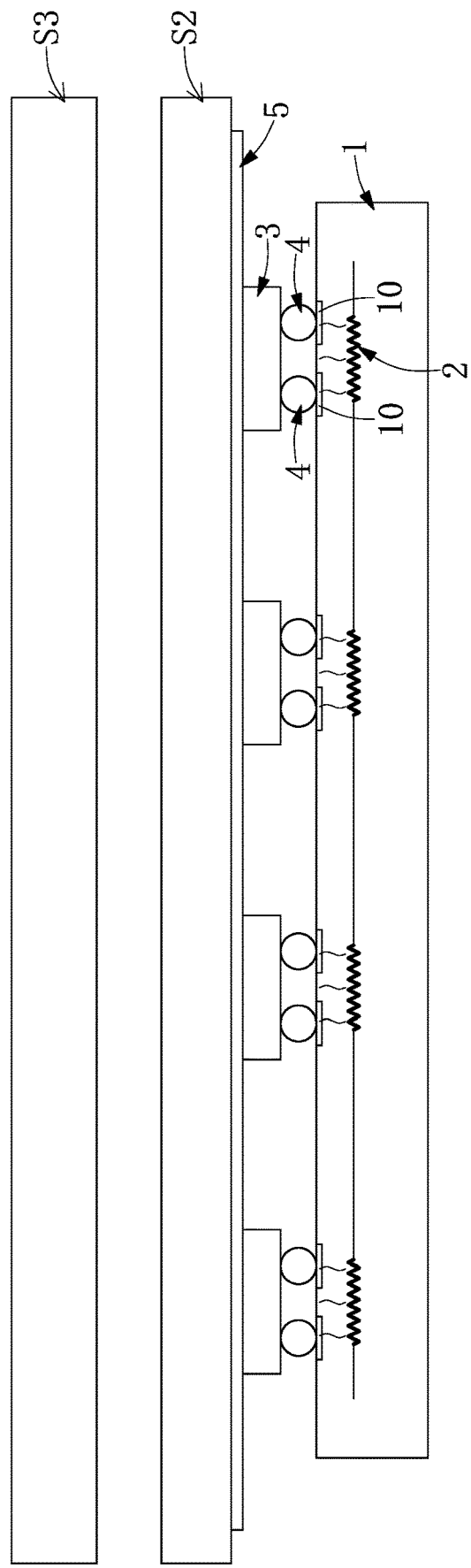
FIG. 9 is a schematic view of the chip mounting structure according to the first embodiment of the present disclosure in use.

Further, as shown in FIG. 7, an adhesive layer 5 may be disposed on the suction structure S2 of the present disclosure, and the plurality of chips 3 may be located on the adhesive layer 5. The suction structure S2 may be a transparent material such as glass, and the adhesive layer 5 may be one of polyetheretherketone (PEEK), benzocyclobutene (BCB), and hydrogen silsesquioxane (HSQ), but the present disclosure is not limited thereto. For example, one or more chips 3 can be transferred to the circuit substrate 1 of the chip mounting structure S1 by the adhesive layer 5 on the suction structure S2. Further, as shown in FIG. 6 to FIG. 9, before each micro heater 2 heats the solder ball 4, a laser source L can project light toward the solder ball 4 through a laser heating module S3, and laser heating module S3 can be placed above the chip mounting structure S1. For example, the laser source L generated by the laser heating module S3 passes through the n-type conductive layer N, the light-emitting layer M and the p-type conductive layer P of the chip 3, and is projected onto the solder ball 4 on the circuit substrate 1 of the chip mounting structure S1. The solder ball 4 is heated in advance by the laser heating module S3, and then the solder ball 4 is heated by the micro heater 2 to greatly reduce the voltage supplied to the micro heater 2; that is, by preheating the solder ball 4 through the laser source L, the temperature preset value that the micro heater 2 should be raised to can be greatly reduced. For example, if the powder ball 4 is heated by the micro heater 2, the temperature of the micro heater 2 is increased to 700 degrees, and the solder ball 4 is preheated in the laser source L; in this situation, the temperature preset value that the micro heater 2 should be raised to can be 400 degrees or less. However, the present disclosure is not limited thereto.

In addition, the first embodiment of the present disclosure further provides a chip mounting device Z, which includes: the chip mounting structure S1 and the suction structure S2. The chip mounting structure S1 includes a circuit substrate 1 and at least one micro heater 2 carried by the circuit substrate 1. The suction structure S2 is disposed above the chip mounting structure S1 to suction and transfer at least one chip 3 to the chip mounting structure S1. The chip 3 is carried by the circuit substrate 1, and the one micro heater 2 heats at least one solder ball 4 that is in contact with the chip 3. The chip 3 is mounted on the circuit substrate 1 by the solder ball 4. The chip 3 is an IC chip or an LED chip. Further, the chip mounting device Z further includes: a laser heating module S3 disposed above the chip mounting structure S1 to project the light generated by the laser source L on the solder ball 4.

However, the above-mentioned examples are only one of the possible embodiments and the present disclosure is not limited thereto.

Second Embodiment

Referring to FIG. 10 to FIG. 14, a second embodiment of the present disclosure provides the chip mounting structure S1 that is slightly similar to the mounting method of the chip of the first embodiment. Therefore, similar steps will not be repeated herein. The difference between the second embodiment of the present disclosure and the first embodiment is that, the micro heater 2 of the chip mounting structure S1 of the present embodiment may be disposed between adjacent two solder pads 10, that is, at least one micro heater 2 is disposed on one side of the at least one chip 3.

Firstly, as shown in FIG. 10, the chip mounting structure S1 of the present disclosure includes a circuit substrate 1 and a plurality of micro heaters 2, and each of the micro heaters 2 can be disposed between the adjacent solder pads 10, but the present disclosure is not limited thereto.

Next, as shown in FIG. 11, one or more chips 3 are transferred to the circuit substrate 1 of the chip mounting structure S1 by the suction structure S2 disposed above the chip mounting structure S1.

Figure 12:
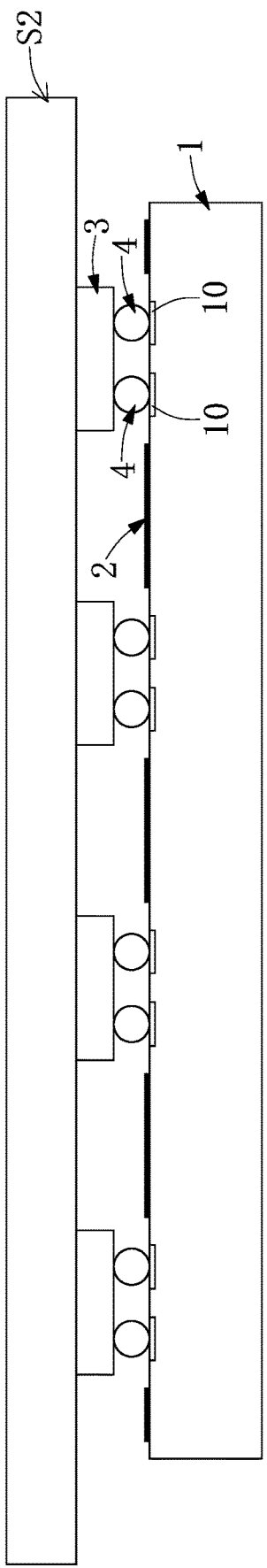
FIG. 12 is a schematic view of the chip mounting structure according to the second embodiment of the present disclosure in use.

Finally, as shown in FIG. 12, by supplying electric energy to each of the micro heaters 2 on the circuit substrate 1, each of the micro heaters 2 heats at least one solder ball 4 to soften the solder balls 4, thus a connection with the chip 3 is generated. Moreover, after the solder ball 4 is cured, the chip 3 is mounted to the circuit substrate 1 and electrically connected to the circuit substrate 1 through the solder ball 4.

Figure 13:
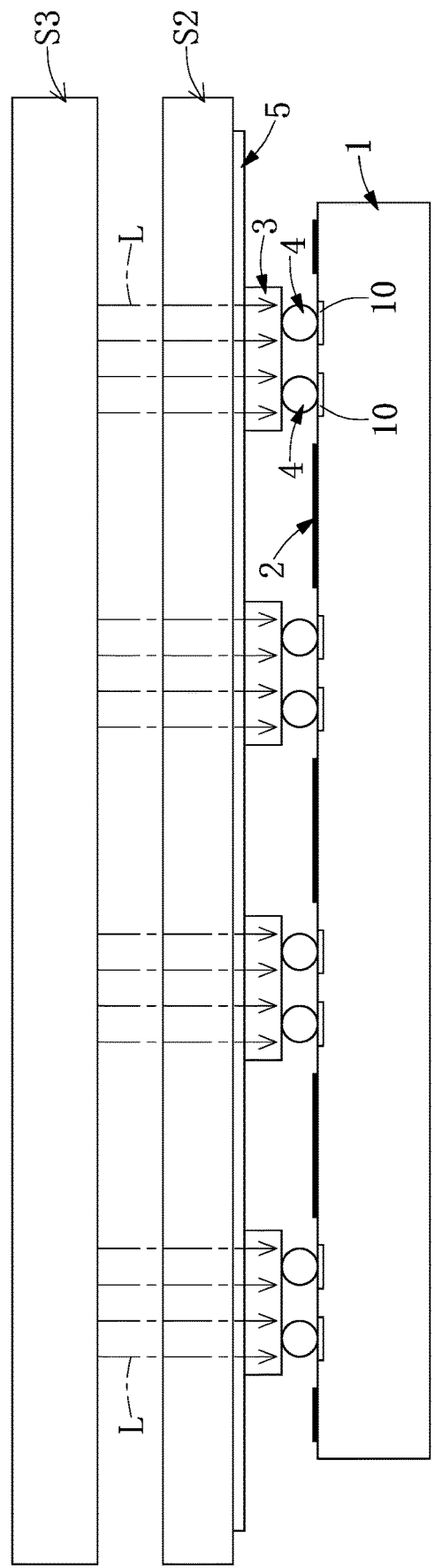
FIG. 13 is a schematic view of the chip mounting structure according to the second embodiment of the present disclosure in use.

Further, as shown in FIG. 13, before each of the micro heaters 2 heats the solder ball 4, the laser source L can project light toward the solder ball 4 through the laser heating module S3. For example, as shown in FIG. 7 to FIG. 9 and FIG. 13, the light generated by the laser source L generated by the laser heating module S3 can be projected to the solder ball 4 on the circuit substrate 1 through the laser heating module S3. The solder ball 4 is heated in advance by the laser heating module S3, and the solder ball 4 is heated by the micro heater 2 to greatly reduce the voltage supplied to the micro heater 2; that is, by preheating the solder ball 4 through the laser source L, the temperature preset value that the micro heater 2 should be raised to can be greatly reduced. For example, if the powder ball 4 is heated by the micro heater 2, the temperature of the micro heater 2 is increased to 700 degrees, and the solder ball 4 is preheated in the laser source L; in this situation, the temperature preset value that the micro heater 2 should be raised to can be 400 degrees or less. However, the above-mentioned examples are only one of the possible embodiments and the present disclosure is not limited thereto.

Figure 14:
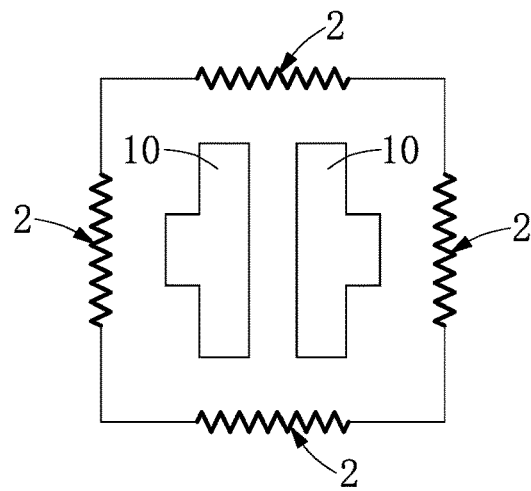
FIG. 14 is a structural schematic view of a micro heater and a solder pad of the chip mounting structure according to the second embodiment of the present disclosure.
Figure 15:
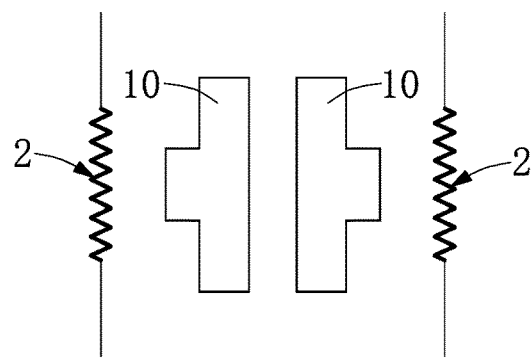
FIG. 15 is a structural schematic view of the micro heater and the solder pad of the chip mounting structure according to the second embodiment of the present disclosure.
Figure 16:
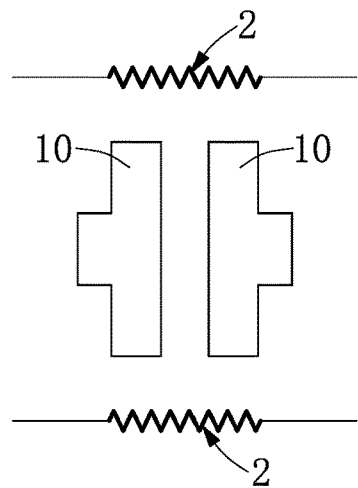
FIG. 16 is a structural schematic view of the micro heater and the solder pad of the chip mounting structure according to the second embodiment of the present disclosure.

Further, as shown in FIG. 14 to FIG. 16, the micro heater 2 of the present disclosure may also be disposed on the periphery of the solder pad 10 (as shown in FIG. 14), or may be disposed on at least two sides of the chip 3, for example, opposite sides of the chip 3 (as shown in FIG. 15 or FIG. 16), but the present disclosure is not limited thereto.

However, the above-mentioned examples are only one of the possible embodiments and the present disclosure is not limited thereto.

In conclusion, one of the beneficial effects of the present disclosure is that, the chip mounting structure S1 provided by the present disclosure has the technical features of "a circuit substrate 1 having a plurality of solder pads 10," "a plurality of micro heaters 2 disposed on the circuit substrate 1 and being adjacent to the solder pads 10" and "a plurality of chips 3 are disposed on the circuit substrate 1 and the chip 3 being electrically connected to the solder pad 10 by a solder ball 4" so as to improve the soldering yield of the process.

Another beneficial effect of the present disclosure is that, the chip mounting structure S1 provided by the present disclosure has the technical features of "a circuit substrate 1 carrying at least one chip 3," and "at least one micro heater 2 is carried by the circuit substrate 1 to heat at least one solder balls 5 that the chip 3 is in contact with" so as to improve the soldering yield of the process.

Another beneficial effect of the present disclosure is that, the chip mounting device Z provided by the present disclosure has the technical features of "a chip mounting structure S1 including a circuit substrate 1 and at least one micro heater 2 carried by the circuit substrate 1," "a suction structure S2 disposed above the chip mounting structure S1 to suction and transfer at least one chip 3 to the chip mounting structure S1" and "the chip 3 being carried by the circuit substrate 1, and the micro heater 2 heating at least one solder ball 4 that is in contact with the chip 3" so as to improve the soldering yield of the process.

Further, the chip mounting structure S1 and the chip mounting device Z provided by the present disclosure heat the solder ball 4 on the circuit substrate 1 by using the micro heater 2 on the chip mounting structure S1 to improve the soldering yield of the process by the technical solutions of the above-mentioned embodiments. In addition, the present disclosure can further preheat the solder ball 4 with the laser source L generated by the laser heating module S3, so that the preset value of the temperature that the micro heater 2 should be raised to can be greatly reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A mounting structure, comprising:
a substrate including a plurality of solder pads; and
a plurality of micro heaters disposed on the substrate and adjacent to the plurality of solder pads;
wherein a plurality of electronic components are disposed on the substrate, and each of the plurality of electronic components is electrically connected to each of the plurality of solder pads by a solder, wherein the plurality of micro heaters are configured for melting the solder to be formed between the plurality of electronic components and the substrate, and the plurality of and the plurality of micro heaters are not vertically aligned below the electronic components when viewed from above.

2. The mounting structure according to claim 1, wherein the substrate is a single substrate or a composite substrate.

3. The mounting structure according to claim 1, wherein the plurality of electronic components are respectively disposed above the plurality of micro heaters and the plurality of electronic components include IC chips or LED chips.

4. A mounting structure, comprising:
a substrate carrying at least one electronic component; and
at least one micro heater carried by the substrate for heating at least one solder that the at least one electronic component is in contact with, wherein the at least one micro heater is configured for melting the at least one solder to be formed between the at least one electronic component and the substrate, and the at least one and the at least one micro heater is not vertically aligned below the at least one electronic component when viewed from above.

5. The mounting structure according to claim 4, wherein the at least one electronic component is mounted onto the substrate by the at least one solder and detached from the substrate.

6. The mounting structure according to claim 4, wherein the at least one micro heater is disposed at one side of the at least one electronic component.

7. A mounting device, comprising:
a mounting structure including a substrate and at least one micro heater carried by the substrate; and
a suction structure disposed above the mounting structure to suction and transfer at least one electronic component to the mounting structure;
wherein the at least one electronic component is carried by the substrate, and the at least one micro heater heats at least one solder that the at least one electronic component is in contact with, wherein the at least one micro heater is configured for melting the at least one solder to be formed between the at least one electronic component and the substrate, and the at least one and the at least one micro heater is not vertically aligned below the at least one electronic component when viewed from above.

8. The mounting device according to claim 7, wherein the at least one electronic component is mounted onto the substrate by the at least one solder; wherein the at least one electronic component includes an IC chip or an LED chip; wherein the suction structure includes a vacuum nozzle module or an electrostatic suction module.

9. The mounting device according to claim 7, further comprising: a laser heating module disposed above the mounting structure to project a light generated by a laser source on the at least one solder.

10. A mounting structure, comprising:
a substrate; and
at least one micro heater formed at the substrate, wherein:
the at least one micro heater is configured for melting at least one solder;
the mounting structure at least adapts to mount at least one electronic component;
the at least one electronic component is contacted and electrically connected to the at least one solder; and
the at least one and the at least one micro heater is not vertically aligned below the at least one electronic component when viewed from above.

11. The mounting structure according to claim 10, wherein the at least one micro heater embedded in the substrate.

12. The mounting structure according to claim 10, wherein the at least one micro heater disposed on the substrate.

13. The mounting structure according to claim 10, wherein the at least one micro heater and the at least one electronic component are not overlapped in an orthographic projection direction.

14. The mounting structure according to claim 10, wherein the at least one micro heater includes a plurality of micro heaters, and the plurality of micro heaters are disposed at at least two sides of a periphery of the at least one electronic component.

15. The mounting structure according to claim 10, wherein the at least one solder to be formed between the at least one electronic component and the substrate.

\* \* \* \* \*